(12) United States Patent
Yamashita

(10) Patent No.: US 6,316,949 B1
(45) Date of Patent: Nov. 13, 2001

(54) APPARATUS AND METHOD FOR TESTING ELECTRIC CONDUCTIVITY OF CIRCUIT PATH WAYS ON CIRCUIT BOARD

(75) Inventor: Munehiro Yamashita, Sakurai (JP)

(73) Assignee: Nidec-Read Corporation, Uji (JP)

( * ) Notice: Subject to any disclaimer, the term of this patent is extended or adjusted under 35 U.S.C. 154(b) by 0 days.

(21) Appl. No.: 09/484,415

(22) Filed: Jan. 18, 2000

(30) Foreign Application Priority Data

Jan. 19, 1999 (JP) .................................................. 11-011165
Dec. 10, 1999 (JP) .................................................. 11-351587

(51) Int. Cl.$^7$ .................................................. G01R 27/26
(52) U.S. Cl. ............................................. 324/683; 324/530
(58) Field of Search .................................... 324/537, 530, 324/99 R, 521, 756, 519, 683

(56) References Cited

U.S. PATENT DOCUMENTS

| | | | |
|---|---|---|---|
| 5,029,464 | * 7/1991 | Lehmann | 73/49.3 |
| 5,373,245 | * 12/1994 | Vranish | 324/662 |
| 5,517,110 | 5/1996 | Soiferman | 324/158.1 |
| 5,557,209 | * 9/1996 | Crook et al. | 324/537 |
| 5,578,930 | * 11/1996 | Sheen | 324/530 |
| 5,621,327 | * 4/1997 | Chiang et al. | 324/537 |
| 5,969,530 | 10/1999 | Yamashita | 324/537 |

* cited by examiner

Primary Examiner—Safet Metjahic
Assistant Examiner—Vincent Q. Nguyen
(74) Attorney, Agent, or Firm—Smith Patent Office

(57) ABSTRACT

A testing apparatus and method for testing conductivity of electric pathways formed on a substrate, each pathway including a first wiring and a second wiring partially overlapping each other. The apparatus includes a first electric signal applier for applying a first electric signal having an electric parameter changing with time to an input portion of the first wiring, a first electrode facing a first portion of the second wiring, a second electrode facing a second portion of the second wiring, a second electric signal applier for applying to the second a electrode a second electric signal changing its electric parameter in the phase reverse to that of the first electric signal, and a monitor for monitoring the signal transmitted to the first electrode through its capacitive coupling.

24 Claims, 13 Drawing Sheets

FIG. 8

| PROBE | SWITCH | TEST | | |
|---|---|---|---|---|
| | | 1 | 2 | 3 |
| 20a | SW11 | ON | OFF | OFF |
| | SW12 | OFF | ON | ON |
| 20b | SW21 | OFF | ON | OFF |
| | SW22 | ON | OFF | ON |
| 20c | SW31 | OFF | OFF | ON |
| | SW32 | ON | ON | OFF |

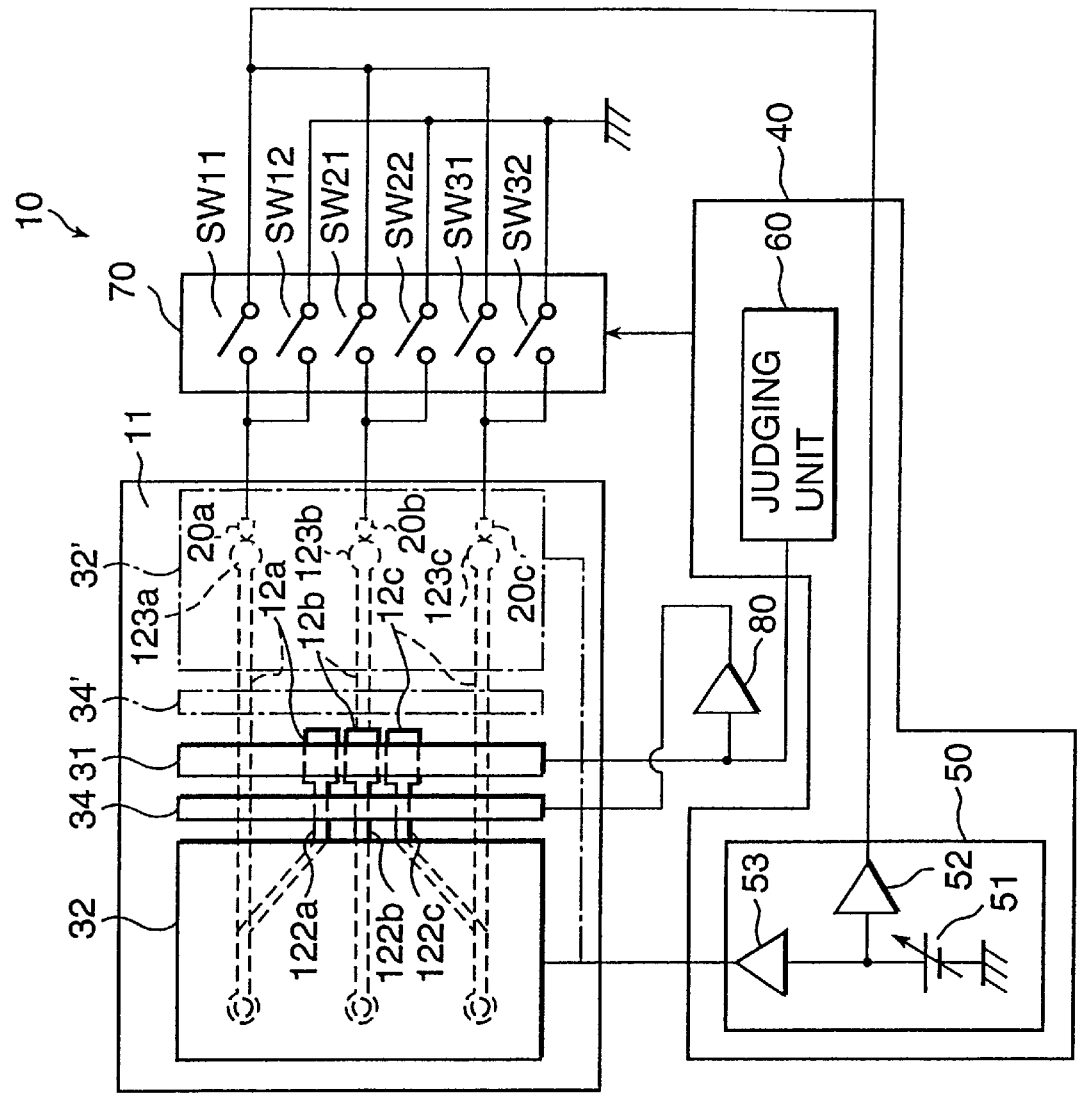

APPARATUS AND METHOD FOR TESTING ELECTRIC CONDUCTIVITY OF CIRCUIT PATH WAYS ON CIRCUIT BOARD

This application claims the Convention priority under 35 U.S.C. 119 based on Japanese patent application Nos. 11-11165 and 11-351587, the contents of which are hereby incorporated by reference.

BACKGROUND OF THE INVENTION

This invention relates to an apparatus and method for testing an open or conductivity of circuit pathways formed on a substrate. the substrate may be a printed circuit board, a glass plate carrying transparent conductors for a liquid crystal display and plasma display panel, a semiconductor package, film carrier, and the like. The circuit pathways are electric conductors as may be identified as lines, traces, tracks, or wiring through which electric signals are transmitted or conveyed.

After a circuit board is formed with electric circuit pathways, conductivity of a pathway and leakage of a current from a pathway to the other are generally tested or inspected for the substrate by means of a circuit board testing apparatus. Such test, sometimes referred to as bare board test, is carried out before electronic devices are mounted on the circuit board in order to determine whether or not the circuit pathways have been properly formed.

One circuit board testing apparatus and method are disclosed in U.S. Pat. No. 5,969,530 co-assigned to the same assignee as that of the present application. The disclosure of the U.S. Patent is incorporated herein by reference. According to this testing method, conductivity test is made with a probe being in contact with one end of a circuit pathway, while an electrode being opposed to the other end of the circuit pathway with a gap to form a capacitive coupling. According to that testing method, a test signal of which electric parameter changes, is supplied to the probe, runs through the pathway and is picked up through the capacitive coupling. The signal may be sinusoidal or sine wave signal, a pulse signal, or a signal appearing when a switch is turned on or off to connect or disconnect a direct current to the probe. Thus, the signal changes its electric parameter to pass through the capacitive coupling between the electrode and the wiring. The prior art method is advantageous in that the electrode may cover a plurality of circuit pathways and that conductivity is tested even if the pitches between the adjacent pathways are small.

However, the testing apparatus and method according to the embodiments as disclosed in the above-mentioned U.S. Pat. No. 5,969,530 have difficulty in detecting when the circuit pathway extends on both surfaces of the board and wirings of the pathway on the both surfaces of the board oppose to each other. The following description with reference to FIGS. 14A and 14B will clarify the difficulty.

With reference to FIGS. 14A and 14B, a wiring 101 formed on a bottom surface of a printed circuit board 100 under test and a wiring 102 formed on a top surface of the board 100 are electrically connected through a viahole conductor 103 with the wirings 101 and 102 opposing to each other. The conductivity of the pathway comprised of the wirings 101 and 102 is detected based on an output derived from a planar electrode 105 located above the wiring 102 when the circuit pathway is applied with an electric signal through the probe 104. It is expected that the electric signal picked up by the electrode 105 is zero or low when an interruption exists on the pathway, while the electric signal is above a predetermined level when the pathway is continuous.

However, in the case of pathway arrangement shown in FIGS. 14A and 14B, the upper and lower wirings 101 and 102 are capacitively coupled with each other when an interruption exists 106 on the pathway. Let's assume that the capacitance for the coupling of the electrode 105 and the wiring 102 is $C_1$, while the capacitance for the coupling of the wiring 101 and 102 is $C_2$.

This situation is likely to occur when a plurality of wirings or electrically conductive layers are formed on one surface of a circuit board or substrate, with the wirings or layers vertically overlap each other or located one above another.

Also, this situation will occur not only with circuit boards but also with other substrates such as a glass or other transparent substrate for a liquid crystal display and a plasma display, a semiconductor package, and film carrier.

In the case that there is the interruption 106 in the wiring 102 as shown in FIGS. 14A and 14B, a total of capacitances Ct between the lower wiring 101 and the planar electrode 105 will be $$C_t = C_1 C_2/(C_1+C_2) \quad (1).$$

In the case that the circuit pathway is continuous, i.e., electrically connected, the total capacitance is equal to the single capacitance $C_1$ since the oppositely arranged wirings 101 and 102 are connected with each other and the capacitance $C_2$ does not appear, that is, the opposite ends of the capacitance $C_2$ are short-circuited.

In general, a capacitance C is expressed by $$C = \epsilon \cdot S/d \quad (2)$$

wherein S, d and $\epsilon$ respectively denote an opposing area of oppositely arranged conductors, a distance between the conductors, and a permittivity of a medium between the conductors. Accordingly, the capacitances $C_1$ and $C_2$ are determined by the area S and the distance d if the permittivity $\epsilon$ of the medium constituting the board 100 is substantially the same as that of the air between the board 100 and the planar electrode 105.

In FIGS. 14A and 14B, it is assumed as the case of normal situation that the distance $d_1$ between the planar electrode 105 and the wiring 102 is smaller than a thickness $d_2$ of the circuit board 100, and an area $S_1$ of the portions of the planar electrode 105 and the wiring 102 that oppose or face each other is smaller than an area $S_2$ of the portions of the wirings 101 and 102 that oppose each other. The relationship of the capacitances $C_1$ and $C_2$ can be expressed:

$$C_2 > C_1 \quad (3)$$

when a ratio $S_2/S_1$ is greater than a ratio $d_2/d_1$. This situation normally occur when the wirings 101 and 102 oppose or face each other for a substantial extension.

Here, $C_2$ will become very greater than $C_1$ when the ratio $S_2/S_1$ is considerably large. In this case, Equation (1) is rewritten as follows:

$$C_1 \cdot C_2/(C_1+C_2) = C_1/(C_1/C_2+1) \approx C_1. \quad (4)$$

Accordingly, it can be understood that the output of the planar electrode 105 is not noticeably different between in a state where the circuit pathway under test has an interruption and in a state where the circuit pathway under test has no interruption. Consequently, the conventional circuit board testing apparatus cannot satisfactorily distinguish defective circuit boards from good circuit boards in the case as discussed above.

SUMMARY OF THE INVENTION

It is an object of the present invention to provide an improved apparatus for testing conductivity of electric pathways formed on a substrate.

It is another object of the present invention to provide an apparatus that detects continuity and discontinuity of wirings of electric pathways on a substrate even when the wirings are located one above another.

It is still another object of the present invention to provide a printed circuit testing apparatus that detects defect and non-defect of electric pathways or conductors of a printed circuit with high signal to noise ratio.

It is yet another object of the present invention to provide a testing apparatus for detecting electric conductivity of a pathway of a circuit pattern formed on a substrate with high accuracy.

It is further object of the present invention to provide a method of detecting conductivity of a pathway or conductor of a circuit pattern on a substrate with high accuracy and high signal to noise ratio.

It is still further object of the present invention to provide an improved method of detecting defect and non-defect of continuous pathways which overlap one another.

In one aspect of the invention, a circuit conductivity testing apparatus is adapted for testing conductivity of circuit pathways formed on a substrate, and including a first wiring and a second wiring which overlap each other. The apparatus includes a first electric signal applier for applying, to a particular portion of the first wiring, a first electric signal having an electric parameter changing with time. The apparatus further includes a first electrode facing a first particular portion of the second wiring, and a second electrode facing a second particular portion of the second wiring, a second electric signal applier for applying, to the second electrode, a second electric signal having an electric parameter changing with time with a phase reverse to that of the first electric signal, and a nudger electrically connected with the first electrode to judge, based on an output of the first electrode, whether there is a defect in the current pathway.

In further aspect of the present invention, the first electrode faces or opposes to the first particular portion of the second wiring with a gap to be capacitively coupled with the first particular portion. The second electrode is capacitively coupled with the second particular portion of the second wiring. The electric signals change their electric parameter such that the signals may be transmitted through the capacitive coupling. The second electric signal serves to cancel, offset or reduce the effect of the capacitive coupling between the first and second wiring.

In another aspect of the invention, a method for testing conductivity of circuit pathways having a first wiring and a second wiring formed on a substrate and which overlaps each other. The method comprises steps of applying a first electric signal to a particular portion of the first wiring, and applying a second electric signal to a first particular portion of the second wiring. The first electric signal has an electric parameter changing with time, and the second electric signal has an electric parameter changing with time with a phase reverse to that of the first electric signal. The method further comprises steps of obtaining an electric output caused on the second wiring by the application of the first and second electric signals, and judging based on the electric output from the second wiring whether there is a defect in the current pathway.

In still another aspect of the present invention, the second electric signal is applied to the particular portion of the second wiring with a gap to be capacitively coupled with the particular portion. An electric output caused on the second wiring by the application of the first and second electric signals is derived by use of an electrode capacitively coupled with another particular portion of the second wiring. The electric signals change their electric parameters such that the signals may be transmitted through the capacitive coupling. The second electric signal serves to cancel, offset or reduce the effect of the capacitive coupling between the first and second wiring.

According to an embodiment of the invention, the first and second electrodes may be spaced away from the first and second particular portions, respectively. Further, a third electrode may be disposed between the first and second electrodes. The third electrode is grounded, or is applied with the output of the first electrode. The second electric signal may be applied to the second wiring in such a why that an electric level caused on the second wiring by the second electric signal is greater than an electric level caused on the second wiring by the first electric signal under presence of a defect in the circuit pathway.

Further, a switcher may be provided for sequentially and selectively applying the first electric signal to respective particular portions of a plurality of first wirings of the circuit pathways.

The circuit testing apparatus may be used for a circuit board formed with the particular portion of the first wiring on one surface and the first particular portion of the second wiring on the other surface. Alternatively, the circuit testing apparatus may be used for a circuit board formed with the particular portion of the first wiring on the same surface as the first particular portion of the second wiring.

The first electric signal applier may be provided with a probe operable to come into contact with the particular portion of the first wiring.

These and other objects, features and advantages of the present invention will become move apparent upon a reading of the following detailed description and accompanying drawings.

BRIEF DESCRIPTION OF THE INVENTION

FIG. 8 is a table showing respective operational states of switches of the circuit board testing apparatus of the second embodiment;

FIG. 9 is a block diagram showing an electrical construction of a circuit board testing apparatus according to a third embodiment of the invention;

DETAILED DESCRIPTION OF THE PREFERRED EMBODIMENTS OF THE INVENTION

Figure 1A:
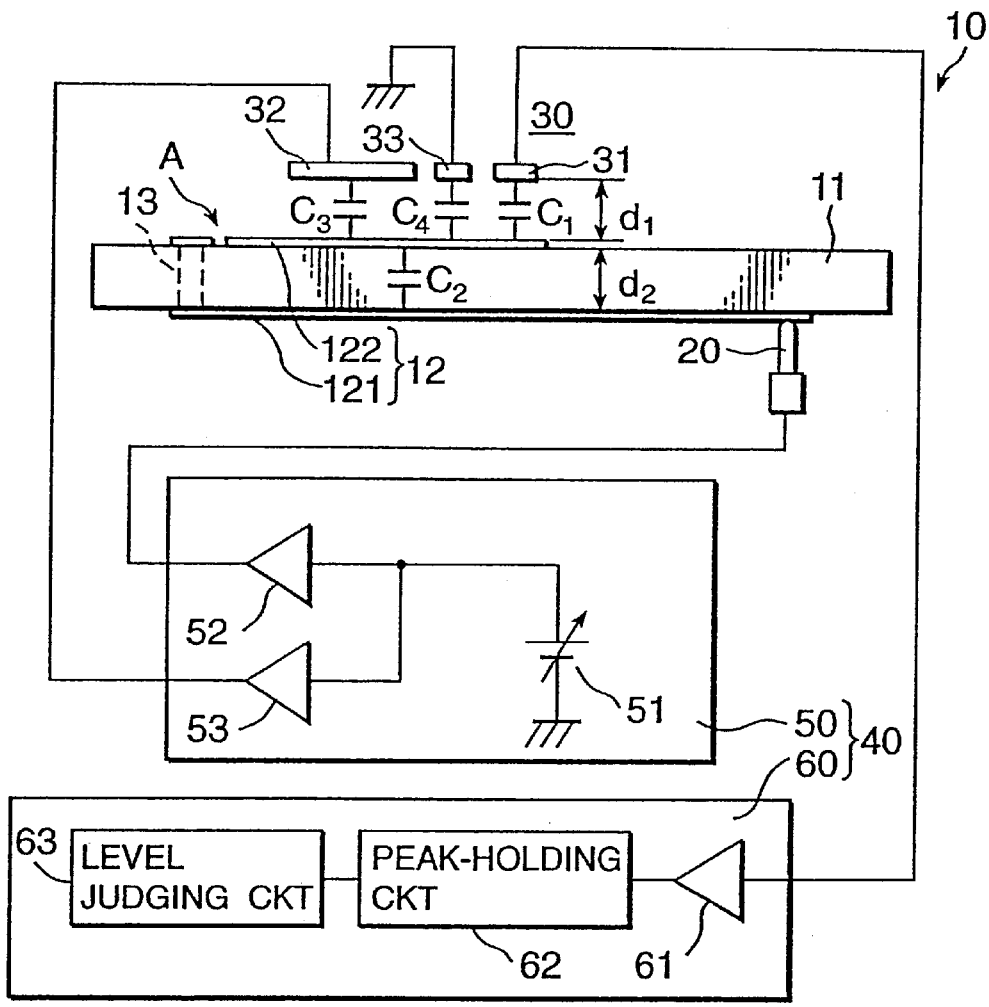
FIG. 1A is a block diagram showing an electrical construction of a circuit board testing apparatus according to a first embodiment of the invention.

A circuit board testing apparatus according to a first embodiment of the invention will be described with reference to FIGS. 1A through 6. A circuit board testing apparatus 10 is provided with a probe 20, a sensor unit 30 and a controller 40. The controller 40 includes a signal applying unit 50 and a judging unit 60. This circuit board testing apparatus 10 is adapted to test a conductivity between circuit pathways formed on opposite surfaces of a circuit board 11.

Figure 2A:
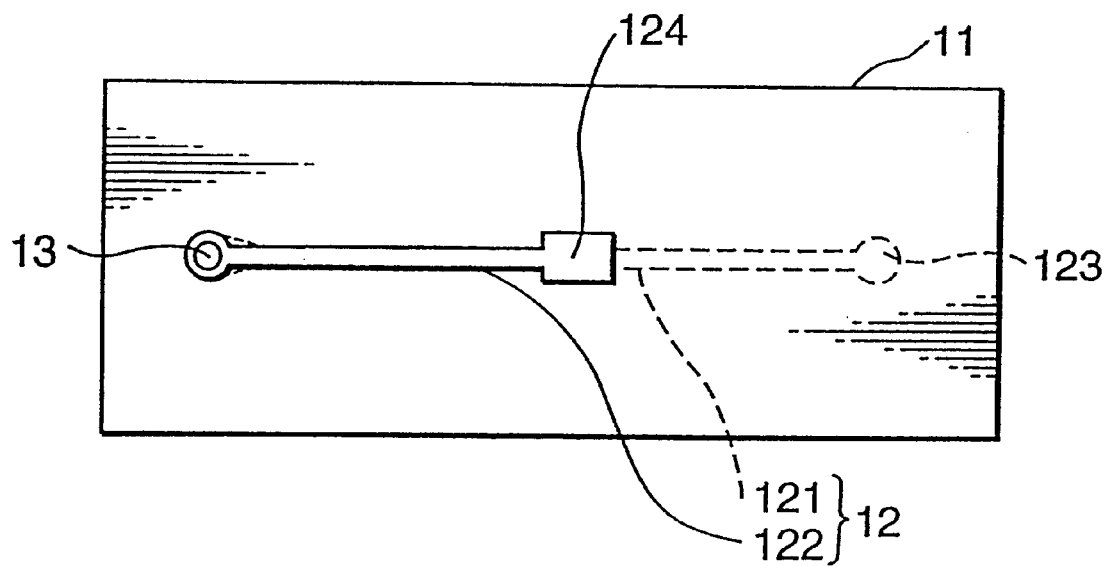
FIG. 2A is a plan view of the circuit board to be tested.
Figure 2B:
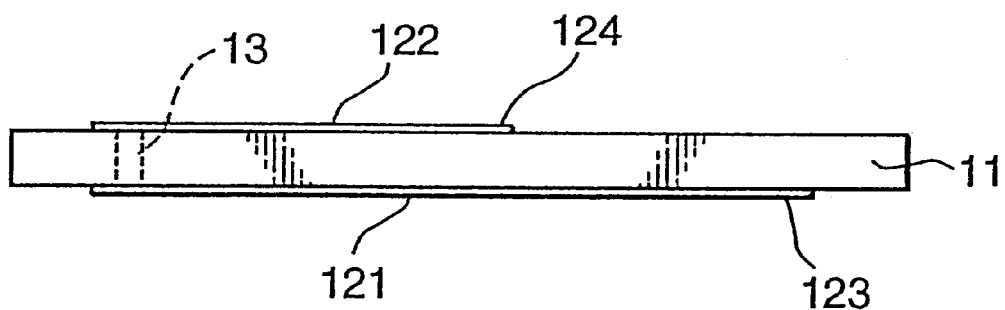
FIG. 2B is a side view of the circuit board to be tested.

FIGS. 2A and 2B show a construction of the circuit board 11. Although actual circuit boards are formed with a plurality of circuit pathways, only a circuit pathway 12 is illustrated in drawings for the sake of simplicity. The circuit pathway 12 includes a wiring 121 formed on a bottom surface, a wiring 122 formed on a top surface, and a viahole conductor 13 passing through a main body of the circuit board 11. The wirings 121 and 122 are arranged one above the other or vertically overlap and face or opposed to each other. The testing apparatus 10 tests a conductivity between an end 123 of the wiring 121 and an end 124 of the wiring 122. Both ends 123 and 124 have the form of a pad.

Referring back to FIGS. 1A and 1B, the probe 20 is movable toward and away from the bottom surface of the circuit board 11, and is to be connected with the signal applying unit 50. Accordingly, the probe 20 is brought into contact with the end 123 of the wiring 121 to apply a voltage as a test signal to the end 123. The test signal may be such as shown in U.S. Pat. No. 5,969,530. In other words, the signal may be a sinusoidal or sine wave signal, a pulse signal, or a signal appearing when a switch is turned on or off to connect or disconnect a direct current to the probe. Thus, the signal changes its electric parameter to pass through the capacitive coupling between the wiring 122 and a first electrode 31 to be described later.

Figure 3A:
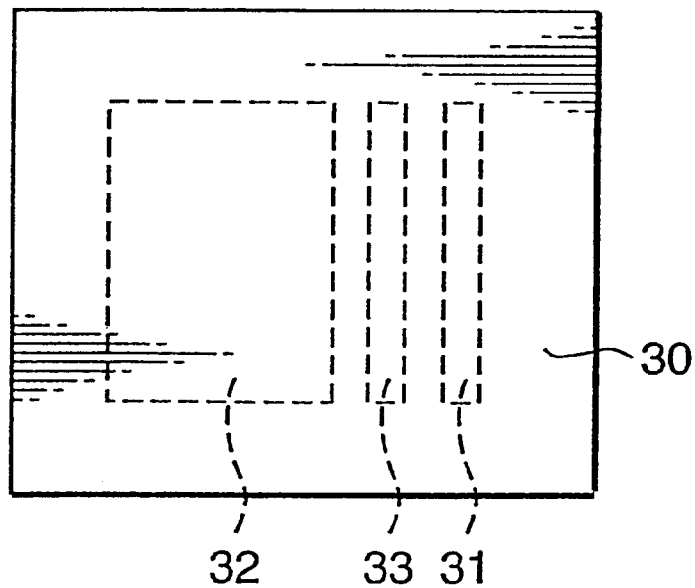
FIG. 3A is a plan view showing an arrangement of planar electrodes on the sensor unit.
Figure 3B:
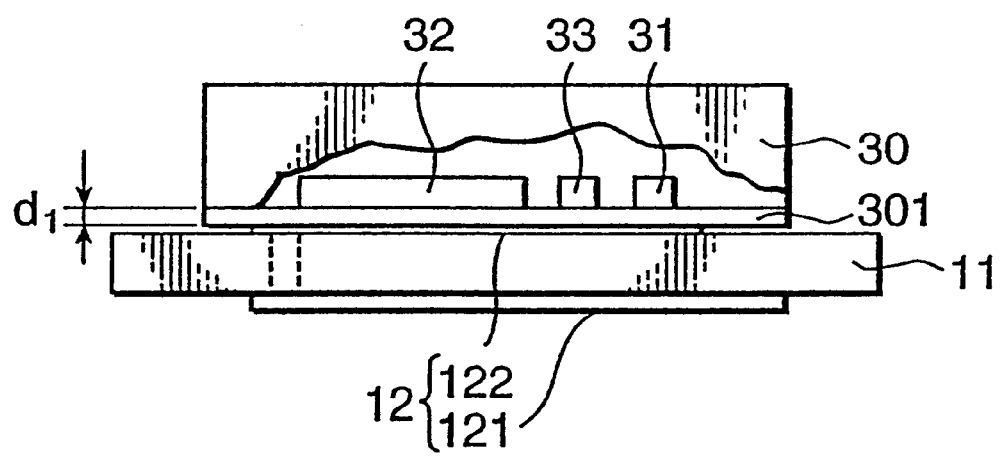
FIG. 3B is a partially cut-away side view showing a location of the sensor unit relative to a circuit board under test.

As shown in FIGS. 3A and 3B, the sensor unit 30 includes first to third planar electrodes 31, 32 and 33, and is movable toward and away from the top surface of the circuit board 11. A bottom surface of the sensor unit 30 is coated by an insulating film 301. The film is made of a hard synthetic resin, and has a thickness d1, e.g., 0.03 mm. When the sensor unit 30 is placed on the circuit board 11, the wiring 121 and the electrodes 31 to 33 are electrically spaced from each other by the specified distance d1.

Figure 1B:
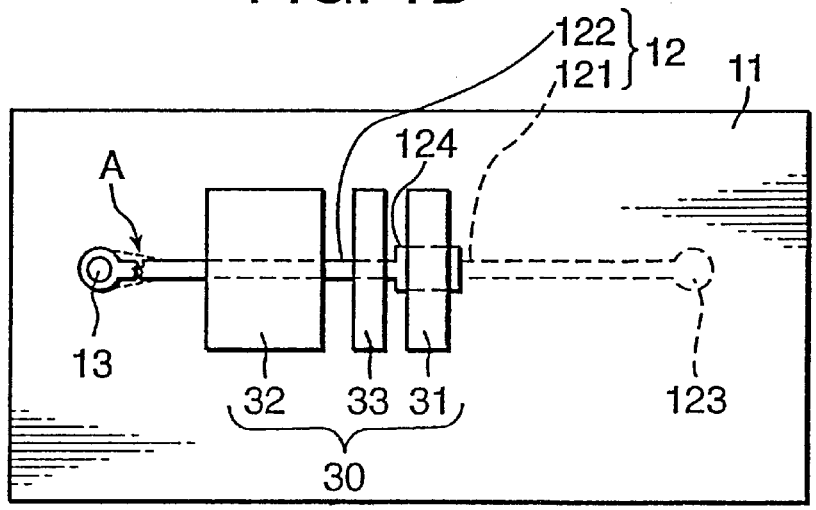
FIG. 1B is a plan view showing a positional relationship of planar electrodes of a sensor unit and a circuit board.

As shown in FIG. 1B, the first planar electrode 31 is arranged so as to oppose to the end 124 of the wiring 122, and is connected with the judging unit 60. The second planar electrode 32 is arranged so as to oppose to a portion between the end 124 of the wiring 122 and the viahole conductor 13, and is connected with the signal applying unit 50. The third planar electrode 33 is arranged so as to oppose to a portion of the wiring 122 between its portion adjacent to the first planar electrode 31 and the portion adjacent to the second planar electrode 32, and is grounded. It should be noted that only one set of the planar electrodes 31 through 33 of a sensor unit 30 are shown in FIG. 1B to cover a single wiring 122 for the sake of simplicity. However, the set of electrodes may cover a plurality of wirings, and a plurality of sensor units, each having the set of electrodes, may be provided to test a circuit board.

The signal applying unit 50 of the controller 40 is provided with a voltage output device 51, an amplifier 52 and an inverting amplifier 53. Respective input terminals of the amplifiers 52 and 53 are connected to the voltage output device 51, whereas an output terminal of the amplifier 52 is connected to the probe 20 and an output terminal of the inverting amplifier 53 is connected to the second planar electrode 32. The voltage output device 51 outputs a voltage signal whose level changes with time, for example. The amplifier 52 amplifies the inputted voltage signal at a specified amplification factor without changing the phase thereof. The inverting amplifier 53 amplifies the inputted voltage signal at a specified amplification factor while inverting the phase thereof.

Voltage signals of the opposite phases are simultaneously applied to the probe 20 and the second planar electrode 32, respectively. It should be noted that the voltage output device 51 and the amplifier 52 constitute a first signal applying path, and the voltage output device 51 and the inverting amplifier 53 constitute a second signal applying path.

The judging unit 60 is provided with an amplifier 61, a peak-holding circuit 62 and a level judging circuit 63. The amplifier 61 amplifies an output signal of the first planar electrode 31. The peak-holding circuit 62 holds a maximum value of the amplified output signal. The level judging circuit 63 includes a comparator to judge a conductivity of the circuit pathway 12 by comparing the held maximum value with a predetermined reference value.

Next, description will be made about capacitances between the respective planar electrodes 31 to 33 of the sensor unit 30 and the circuit board 11, and a capacitance between the wirings 121 and 122.

It is assumed as shown in FIG. 1A that a capacitance defined by the first planar electrode 31 and the end 124 of the wiring 122 is $C_1$, a capacitance between the wiring 121 on the bottom surface and the wiring 122 on the top surface when the circuit pathway 12 is interrupted is $C_2$, a capacitance between the second planar electrode 32 and the wiring 122 on the top surface is $C_3$, and a capacitance between the third planar electrode 33 and the wiring 122 on the top surface is $C_4$.

In this embodiment, the horizontal size of the second planar electrode 32 is larger than that of the first planar electrode 31 to make the area of the second planar electrode 32 opposing to the wiring 122 greater than that of the first planar electrode 31. In this way, the respective capacitances satisfy the following relationship;

$$C_1 \ll C_2$$
$$C_1 \ll C_3 \quad (5)$$

when the wiring 122 is interrupted at a portion A as shown in FIGS. 1A and 1B.

The circuit board 11 has a fixed thickness $d_2$. The distance $d_1$ between the sensor unit 30 and the circuit board 11, i.e., the thickness of the insulating film 301, is so set as to satisfy the following relationship:

$$C_2 \geq C_3 \quad (6)$$

while $d_1 < d_2$.

Next, operations of the circuit testing apparatus 10 thus constructed will be described with reference to FIGS. 4 and 5A to 5C. As shown in FIG. 5A, a voltage signal which changes with time is outputted from the voltage output device 51, and then outputted from the amplifier 52, and applied to the end 123 of the wiring 121 via the probe 20. As shown in FIG. 5B, simultaneously, a voltage signal having a phase reverse from that of the above voltage signal is outputted from the inverting amplifier 53, and applied to the second planar electrode 32.

Figure 4:
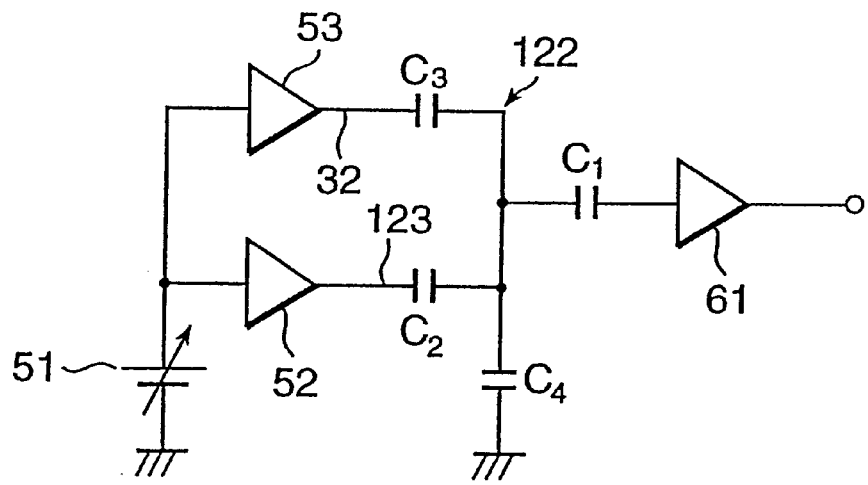
FIG 4 is a diagram showing an equivalent circuit of the electrical relationship of the circuit board testing apparatus and the circuit board.
Figure 5A:
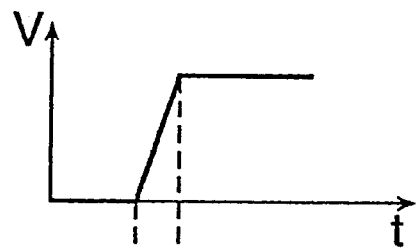
FIG. 5A is a graph showing an output signal of an amplifier of the equivalent circuit shown in FIG. 3.
Figure 5B:
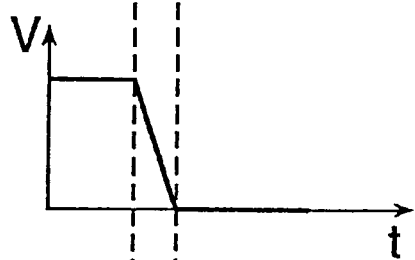
FIG. 5B is a graph showing an output signal of an inverting amplifier of the equivalent circuit shown in FIG. 3.

At this time, if the wiring 122 is interrupted as shown in FIGS. 1A and 1B, the wiring 122 is applied with the voltage signal having the inverted phase at a specified amplitude via a capacitive coupling having the capacitances $C_2$ and $C_3$ as shown in FIG. 4. Accordingly, the output signal of the amplifier 61 becomes substantially zero as shown by the bold solid line P1 in FIG. 5C if $C_2 = C_3$, and becomes negative as shown by the thin solid line P2. in FIG. 5C if $C_2 < C_3$.

On the other hand, in the case where there is no interruption in the circuit pathway 12, the capacitance $C_2$ in FIG. 4 is short-circuited by the wirings 121 and 122. Accordingly, there is no influence of the voltage signal applied via the capacitance $C_3$ as compared to the voltage signal directly applied by the probe 20 held in contact. Consequently, the output signal of the amplifier 61 substantially coincides with the voltage signal applied via the capacitance $C_1$ by the amplifier 52 as shown by the broken line P3 in FIG. 5C.

The maximum value of the output signal of the amplifier 61 is held by the peak-holding circuit 62, and is compared with the predetermined reference value by the level judging circuit 63 to judge as to whether or not the circuit pathway has an opened current.

The second planar electrode 32 opposed to the wiring 122 is provided, and is applied with the voltage signal having a phase reverse frog that of the output signal of the probe 20 as described above. Accordingly, a noticeable difference will exist between the output level of the first planar electrode 31 when the circuit pathway 12 has no opened current and that when the circuit pathway 12 has an opened current. Thus, the conductivity of the circuit pathway 12 can be effectively judged without fail.

Further, since the third planar electrode 33 is arranged between the first and second planar electrodes 31 and 32 and is grounded, the voltage signal of the inverted phase applied to the second planar electrode 32 is kept from transmitting to the first planar electrode 31 by way of a possible capacitive linkage of the first electrode 31 and the second electrode 32. In other words, the third electrode 33 intervenes between the electrodes 31 and 32 to block the interference therebetween.

Figure 6:
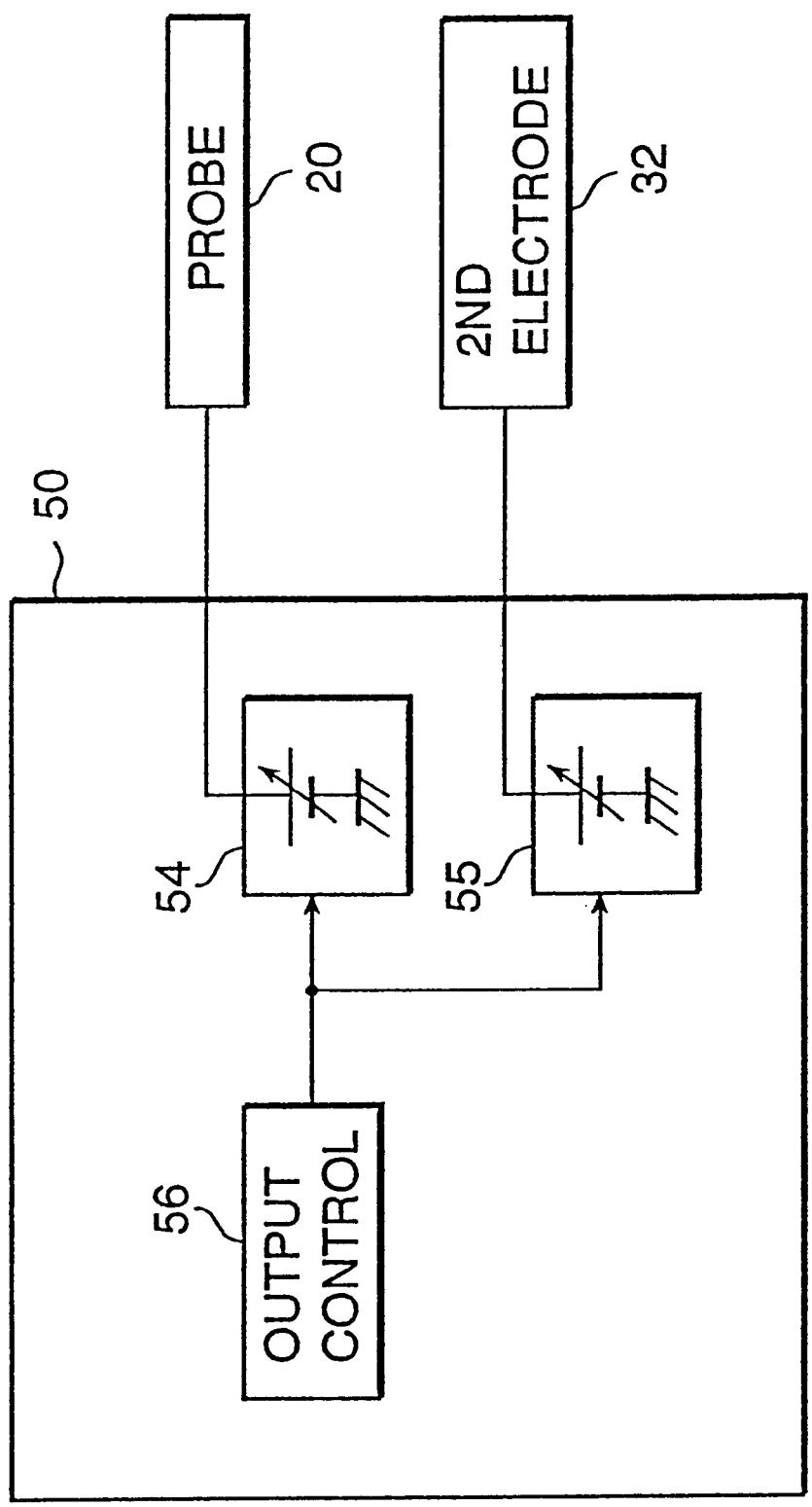
FIG. 6 is a block diagram showing a modified signal applying unit for the board testing apparatus shown in FIG. 1A.

Instead of the signal applying unit 50 shown in FIG. 1A, a signal applying unit 50 as shown in FIG. 6 may be used. The signal applying unit 50 comprises a first voltage output device 54 for outputting a voltage signal whose level changes with time in the manner similar to that of the voltage output device 51, a second voltage output device 55 for outputting a voltage signal whose phase is reverse from that of the voltage signal outputted from the voltage output device 54, and an output control device 56 for controlling the voltage output devices 54 and 55 to simultaneously output the voltage signals.

Figure 7:
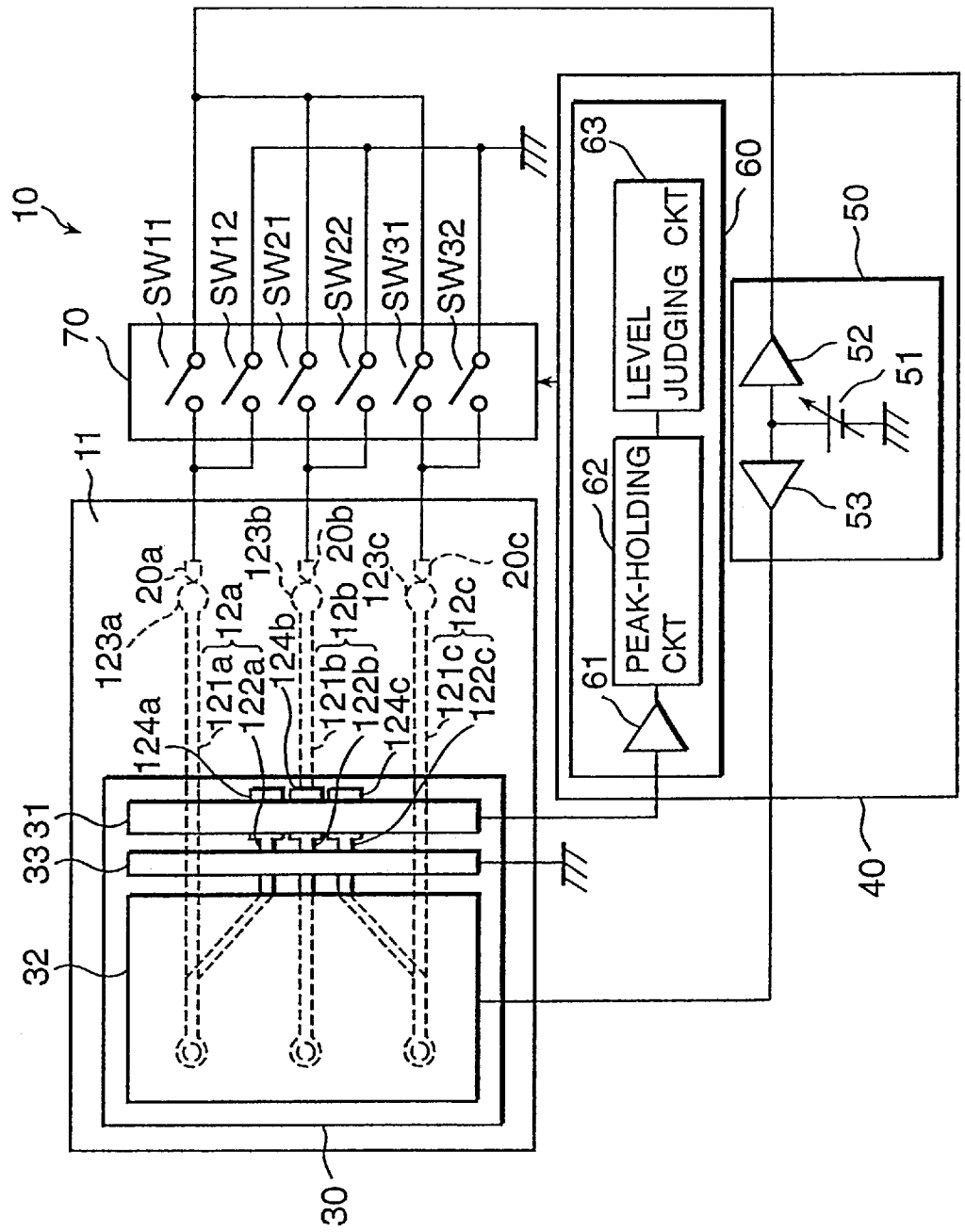
FIG. 7 is a block diagram showing an electrical construction of a circuit board testing apparatus according to a second embodiment of the invention.

Next, a circuit board testing apparatus according to a second embodiment of the present invention will be described with reference to FIGS. 7 and 8. FIG. 7 shows an electrical construction of the second embodiment, and FIG. 8 shows respective operational states of switches during each stage of tests conducted in this embodiment. It should be noted that the same elements as in the first embodiment are indicated with the same reference numerals.

In this embodiment, conductivity tests are conducted for a plurality of circuit pathways, for example, three circuit pathways 12a, 12b and 12c formed on both surfaces of a circuit board 11 as shown in FIG. 7. Specifically, a circuit board testing apparatus 10 is provided with three probes 20a, 20b, and 20c, a sensor unit 30, a controller 40, and a switch unit 70. The controller 40 includes a signal applying unit 50 and a judging unit 60 which are substantially the same in construction as those of the first embodiment. Similarly to the first embodiment, the sensor unit 30 includes first to third planar electrodes 31, 32 and 33. However, these planar electrodes 31, 32, and 33 each have such an extent to cover wirings 122a, 122b and 122c formed on a top surface of the circuit board 11 simultaneously. The probes 20a, 20b and 20c are brought into contact with ends 123a, 123b and 123c of wirings 121a, 121b and 121c formed on a bottom surface of the circuit board 11.

The switch unit 70 is constructed by transistors. The switch unit 70 includes switches SW11, SW12, SW21, SW22, SW31 and SW32 of which turning on and off are controlled by the controller 40, respectively.

The probe 20a is to be connected to an output terminal of the amplifier 52 via the switch SW11 and is to be grounded via the switch SW12. The probe 20b is to be connected to the output terminal of the amplifier 52 via the switch SW21 and is to be grounded via the switch SW22. The probe 20c is to be connected to the output terminal of the amplifier 52 via the switch SW31 and is to be grounded via the switch SW32.

The on and off of respective switches of the switch unit 70 is controlled by the controller 40 in the manner as shown in FIG. 8. conductivity test for the circuit pathways 12a, 12b and 12c are successively conducted by applying a voltage signal to the probe 20 in the first test, by applying a voltage signal to the probe 21b in the second tests and by applying a voltage signal to the probe 20c in the third test.

The signal applying unit 50 and the judging unit 60 operate substantially in the same way as in the first embodiment. In this embodiment, the conductivity of a number of circuit pathways formed on the both surfaces of a circuit board can be tested more efficiently.

FIG. 9 is a block diagram showing an electrical construction of an circuit board testing apparatus according to a third embodiment of the invention. It should be noted that the same elements as those in the first and second embodiments are indicated with the same reference numerals.

A circuit board testing apparatus 10 is provided with three probes 20a, 20b, and 20c, a sensor unit 30, a controller 40, and a switch unit 70. The controller 40 includes a signal applying unit 50 and a judging unit 60 which are the same in construction as those of the first and second embodiments.

The sensor unit 30 includes first to third planat electrodes 31, 32 and 34. However, these planar electrodes 31, 32, and 34 each have such an extent to cover wirings 122a, 122b and 122c formed on a top surface of the circuit board simultaneously. However, the third planar electrode 34 in this embodiment is different from the third planar electrode 33 in the first and second embodiments in that it is not grounded as described later.

Further, this circuit board testing apparatus 10 is provided with a non-inverting buffer 80. An input terminal of the buffer 80 is connected to the first planar electrode 31 while an output terminal of the buffer 80 is connected to the third planar electrode 34.

In this construction, when a voltage signal is applied to a probe 20a (20b or 20c) and the second planar electrodes 32 from the signal applying unit 50, a voltage signal outputted from the first planar electrode 31 is applied to the third planar electrode 34. Accordingly, the third planar electrode at the same potential as, that of the first planar electrode 31 keeps the first planar electrode 31 free from an influence of the voltage signal of a reverse phase applied to the second planar electrodes 32.

It will be seen that a composite capacitance occurs between the first planar electrode 31 and the third planar electrode 33 when the latter is grounded as in the first and second embodiments, consequently attenuating the voltage signal outputted from the first planar electrode 31. To ensure conductivity test, accordingly, it is necessary to make smaller the opposing area of the grounded third planar electrode 33 to the circuit pathway 12. In the third embodiment, however, composite capacitance is prevented by making the third planar electrodes 34 at the same potential as that of the first planar electrode 31 in the above-mentioned way instead of grounding the third planar electrode 34. This makes it possible to increase the opposing area of a circuit pathway 12 for conductivity test.

As shown by phantom lines in FIG. 9, also, it may be appreciated to provide another third planar electrode 34' on the other side of the first planar electrode 31 to sandwich the first planar electrode 31 with the two third planar electrodes 34 and 34, and further provide another second planar electrode 32' on the Mother side of the first planar electrode 31 to sandwich the first planar electrode 31 with the two second planar electrodes 32, 32' and the two third planar electrodes 34, 34'. This will reduce the influence of external noise on the first planar electrode 31, thereby assuring more accurate conductivity test.

Next, a circuit board testing apparatus according to a fourth embodiment will be described with reference to FIGS. 10A, 10B, and 11A through 11C. A circuit board testing apparatus of the fourth embodiment is adaptable for testing a circuit board formed with circuit pathways on both surfaces of the circuit board but the both ends of each circuit pathway being on the same surfaces.

Figure 10A:
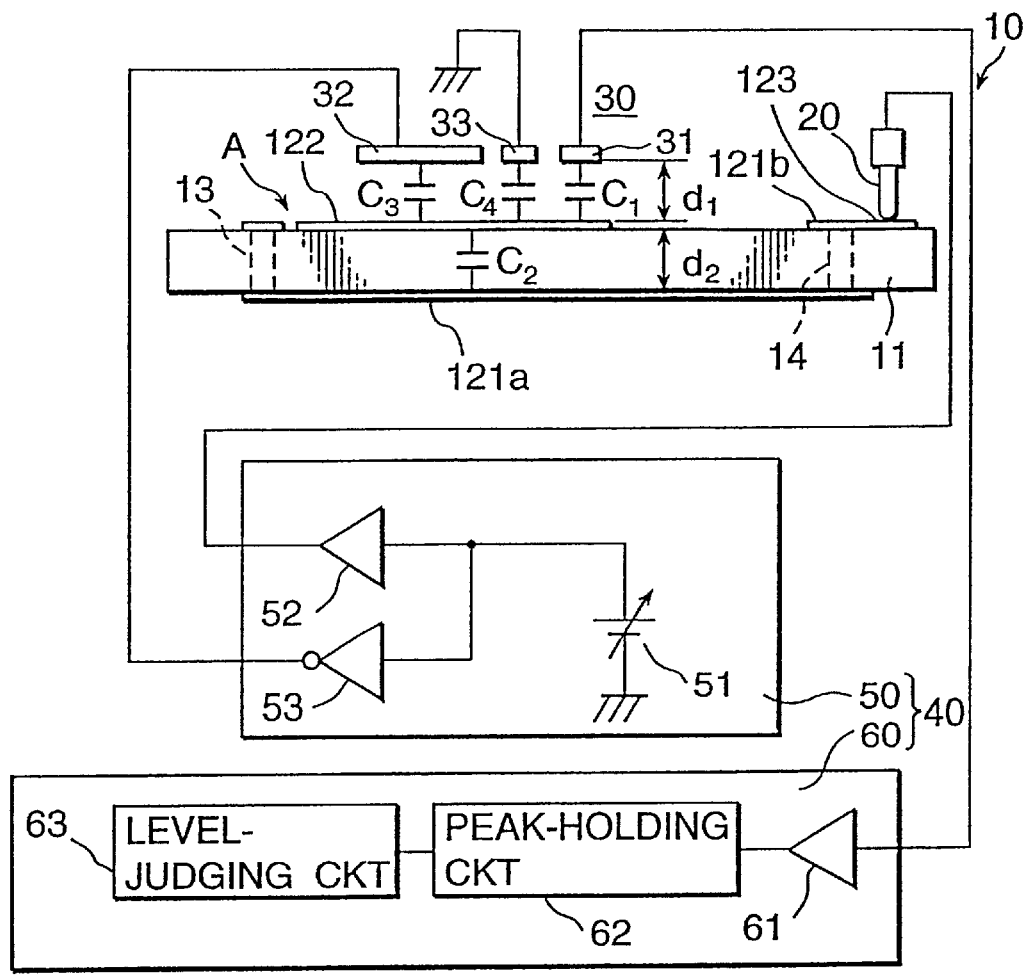
FIG. 10A is a block diagram showing an electrical construction of a circuit board testing apparatus according to a fourth embodiment of the invention.
Figure 10B:
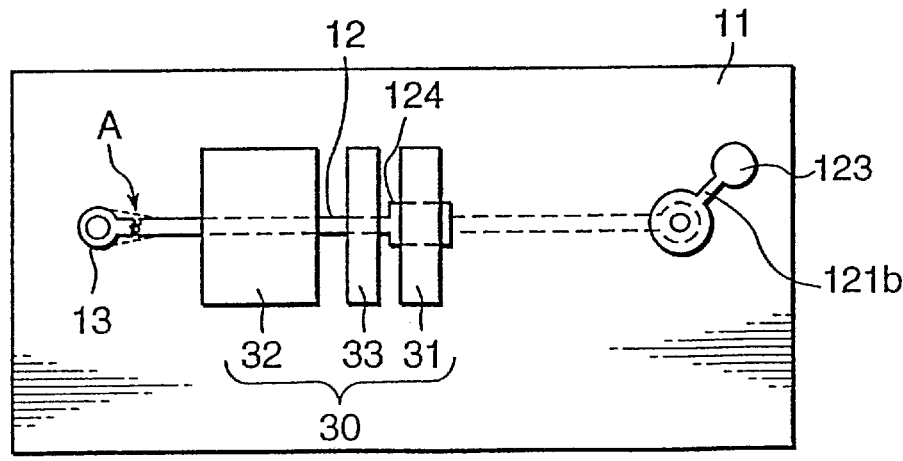
FIG. 10B is a plan view showing a positional relationship of planar electrodes of a sensor unit and a circuit board of the circuit board testing apparatus shown in FIG. 10A.

As shown in FIGS. 10A and 10B, specifically, a circuit board 11 under test is formed with a wiring 121a on a bottom surface, a wiring 122 on a top surface, a wiring 121b on the top surface, a viahole conductor 13 connecting the wiring 121a and the wiring 122, and a viahole conductor 14 connecting the wiring 121a and the wiring 121b. The wiring 122 and the wiring 121b on the same surface are not electrically connected. The wirings 121a and 122 face or oppose to each other, sandwiching the circuit board 11.

A circuit testing apparatus is provided with a probe 20, a sensor unit 30 and a controller 40. The sensor unit 30 and the controller 40 have the same construction as that of the first embodiment. However, the probe 20 is arranged so as to move toward and away from the top surface of the circuit board 11, and thereby come into contact with the end 123 of the wiring 121b formed on the top surface of the circuit 11 to apply a voltage to tie end 123.

Figure 11A:
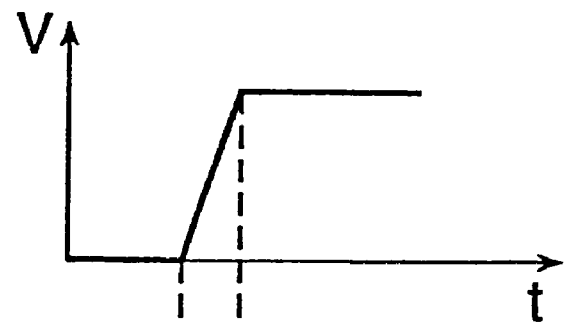
FIG. 11A is a graph showing an output signal of an amplifier of the circuit board testing apparatus shown in FIG. 10A.
Figure 11B:
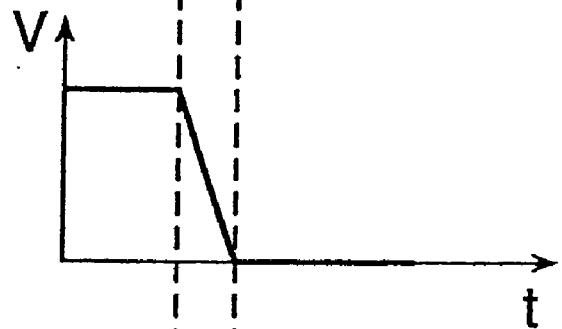
FIG. 11B is a graph showing an output signal of an inverting amplifier of the circuit board testing apparatus shown in FIG. 10A.

The operation of the circuit testing apparatus 10 of the fourth embodiment is carried out in the similar way to the foregoing embodiment. As shown in FIG. 11A, a voltage signal which changes with time is outputted from a voltage output device 51, and then outputted from the amplifier 52, and applied to the end 123 of the wiring 121b via the probe 20. As shown in FIG. 11B, a voltage signal having a phase reverse from that of the above voltage signal is outputted from the inverting amplifier 53, and applied to the second planar electrode 32.

Figure 11C:
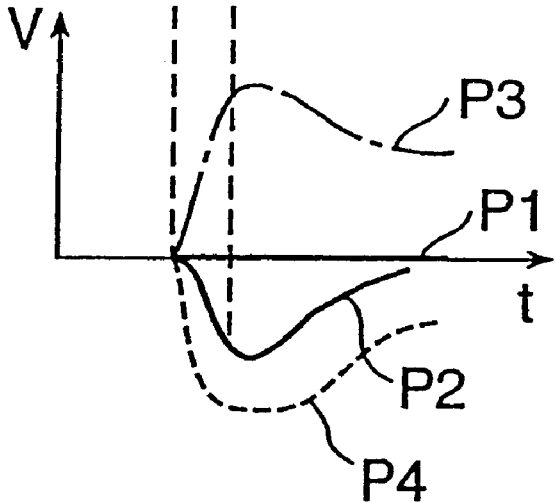
FIG. 11C is a graph showing an output signal of another amplifier of the circuit board testing apparatus shown in FIG. 10A.

If there is no interruption in the circuit pathway 12, the output signal of the amplifier 61 substantially coincides with the voltage, signal applied via the capacitance $C_1$ by the amplifier 52 as shown by the broken line P3 in FIG. 11C as described earlier. On the other hand, if there is an interruption in the wiring 122 or the wiring 121a, the output signal of an amplifier 61 becomes substantially zero as shown by the bold solid line P1 in FIG. 11C if $C_2=C_3$, and becomes negative as shown by the thin solid line P2 in FIG. 11C if $C_2<C_3$ as described earlier.

If there is an interruption. in the wiring 121a or the wiring 121b, the voltage signal applied on the wiring 121b is not transmitted to the wiring 122, but the wiring 121a is applied with the voltage signal having the inverted phase via the capacitance $C_3$. Accordingly, the output signal of the amplifier 61 becomes negative as shown by the dotted line P4 in FIG. 11C.

Accordingly, the circuit board testing apparatus can accurately detect a defect such as the interruption in the circuit pathway, that is, a defect in the viahole conductor 14 connecting the wirings 121a and 121b, in the wiring 121a, in the wiring 122, or in the viahole conductor 13 connecting the wirings 121a and 122.

It should be noted that even if the wiring 121b formed on the top surface has a smaller size, e.g., a land specially provided for testing, the circuit board apparatus of the fourth embodiment can sufficiently accomplish the specified testing operation.

Next will be described testing of a circuit board having a plurality of wirings arranged one above another on one side of the circuit board with reference to FIGS. 12 and 13.

Figure 12:
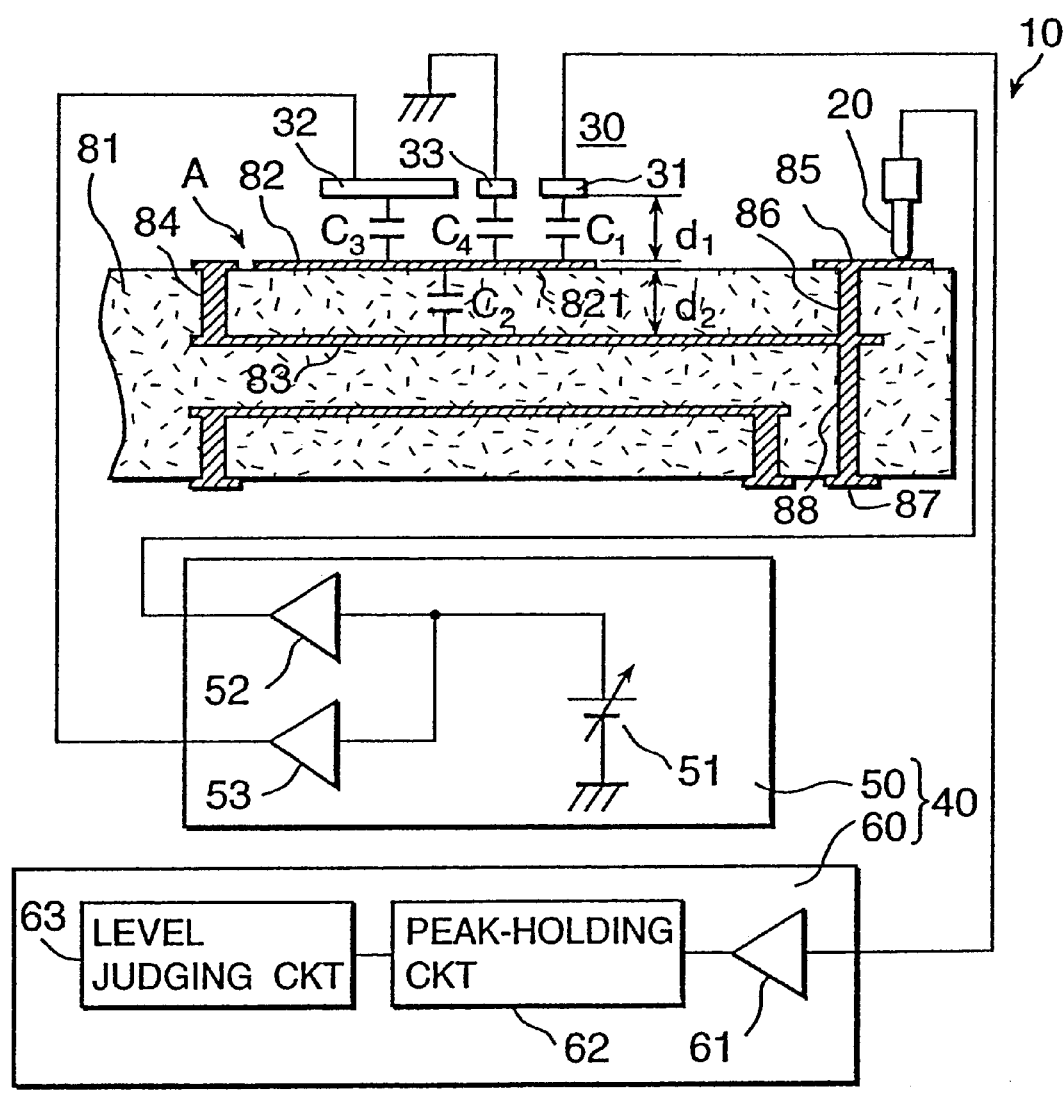
FIG. 12 is a block diagram showing testing of a circuit board formed with wirings therein by an inventive circuit board testing apparatus.

FIG. 12 shows a circuit board 81 formed with a wiring 82 and a wiring 85 on a top surface of an insulating layer, a wiring 83 in the layer, a viahole conductor 84 connecting the outside wiring 82 and the inside wiring 83, and a viahole conductor 86 connecting the outside wiring 85 and the inside wiring 83. The outside wiring 82 opposes to a part of the inside wiring 83 in parallel. Also, the circuit board 81 is formed with a wiring 87 on a bottom of the layer. The wiring 87 is electrically connected with the inside wiring 83 through a viahole conductor 88. A capacitive coupling with a capacitance $C_2$ will be produced between the outside wiring 82 and the inside wiring 83 if a defect occurs in the circuit pathway, e.g., at the position A in FIG. 12. The first to third planar electrodes and the distance d1 of the sensor 30 is so constructed that the capacitance $C_2$ satisfies the above-mentioned Equations (5) and (6).

In the case of the, testing apparatus of the fourth embodiment, as shown in FIG. 12, the probe 20 is brought into contact with the wiring 85 while the sensor 30 is positioned so that the first planar electrode 31 opposes to an end 821 of the wiring 82. In this state, the conductivity of the circuit pathway including the outside wiring 82, the viahole conductor 84, the inside wiring 83, the viahole conductor 86, and the wiring 85 is tested.

In the case of the testing apparatus of the first to third embodiment, alternatively, the probe 20 is brought into contact with a wiring corresponding to the wiring 87 while the sensor 30 is held above the specified top position. In this state, the conductivity of the outside wiring 82, the viahole conductor 84, the inside wiring 83, the viahole conductor 88, and the wiring 87 can be tested.

Figure 13:
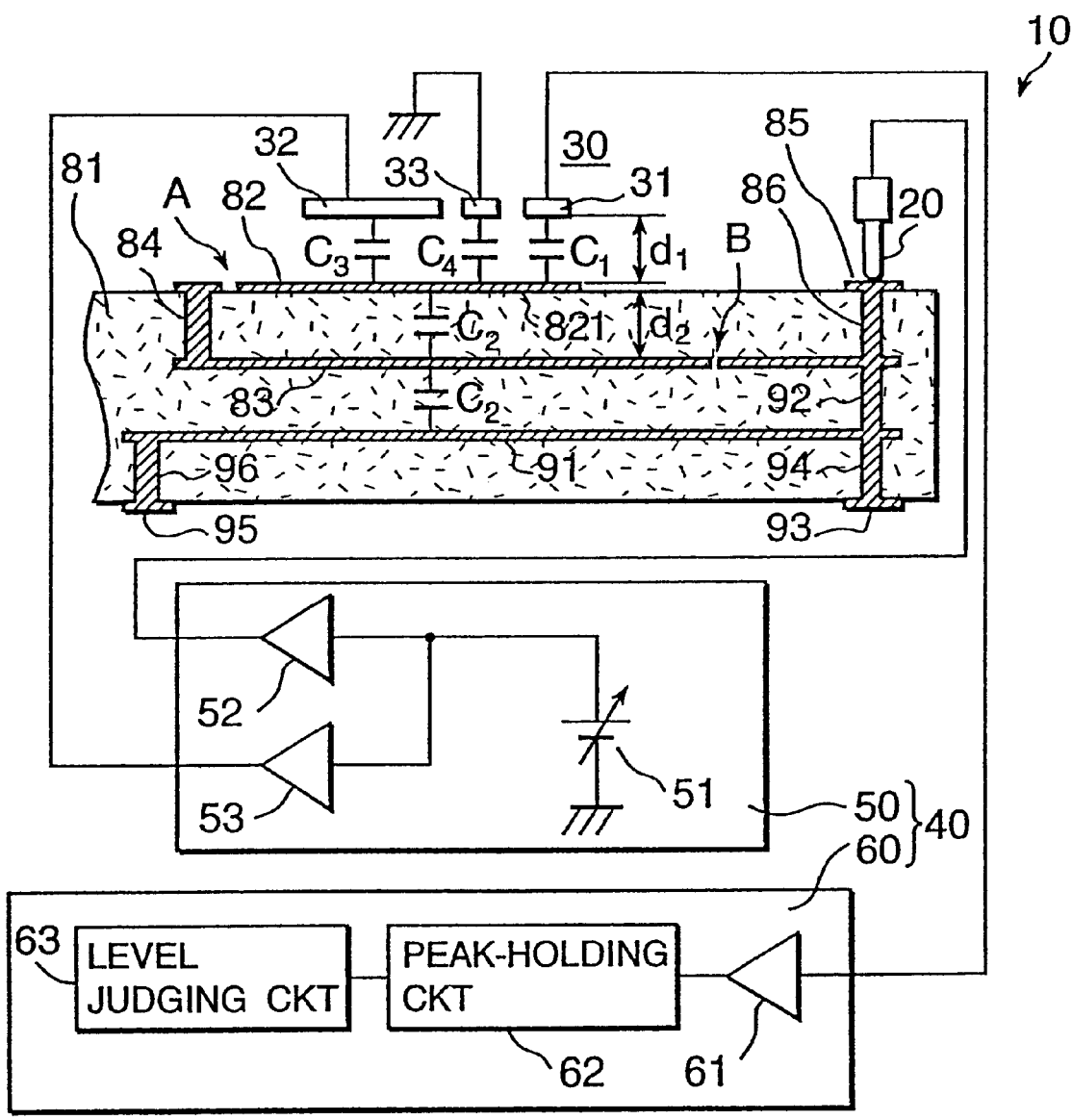
FIG. 13 is a block diagram showing testing of another circuit board formed with wirings therein by an inventive circuit board.
Figure 14A:
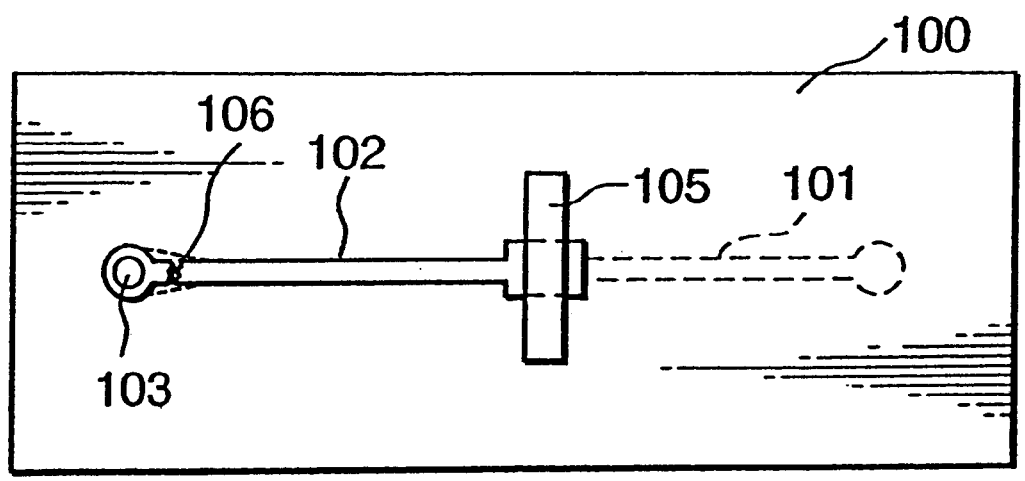
FIGS. 14A and 14B show a conventional conductivity testing.
Figure 14B:
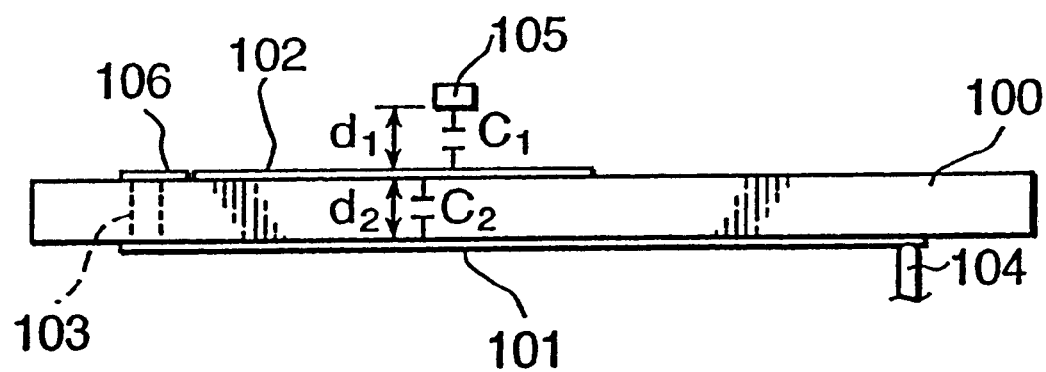

Further, a circuit board 81 shown in FIG. 13 may be tested by a circuit board testing apparatus similar to either of the first to fourth embodiments. The circuit board is formed with a wiring 82 and a wiring 85 on a top surface of an insulating layer, a wiring 83 in the layer, a wiring 91 in the layer, a wiring 93 and a wiring 95 on a bottom of the layer, a viahole conductor 84 connecting the outside wiring 82 and the inside wiring 83, a viahole conductor 86 connecting the outside wiring 85 and the inside wiring 83, a viahole conductor 92 connecting the inside wirings 83 and 91, a viahole conductor 94 connecting the inside wiring 91 and the outside wiring 93, and a viahole conductor 96 connecting the inside wiring 91 and the outside wiring 95. The outside wiring 82 and the inside wirings 83 and 91 oppose to one another.

If a defect occurs in the outside wiring 82, e.g., at the position A in FIG. 13, a capacitive coupling of a capacitance $C_2$ formed between the outside wiring 82 and the inside wring 83 is effectuated. Also, if a defect occurs in the inside wiring 83, e.g., at the position B in FIG. 13, a capacitive coupling of a capacitance $C_2$ formed between the inside wiring 83 and the inside wiring 91 is effectuated. The first to third planar electrodes and the distance d1 of the sensor 30 is so constructed that the capacitance $C_2$ satisfies the above-mentioned Equations (5) and (6).

In the case of the testing apparatus of the fourth embodiment, as shown in FIG. 13, the probe 20 is brought into contact with the wiring 85 while the sensor 30 is positioned so that the first planar electrode 31 opposes to an end 821 of the wiring 82. In this state, the conductivity of the circuit pathway including the outside wiring 82, the viahole conductor 84, the inside wiring 83, the viahole conductor 86, and the wiring 85 is tested.

In the case of the testing apparatus of the first to third embodiments alternatively, the probe 20 is brought into contact with the wiring corresponding to the wiring 93 or 95 formed on the bottom surface while the sensor 30 is held above the specified top position. In the state where the wiring 93 is applied with the specified electric signal through the probe 20, the conductivity of the outside wiring 93, the viahole conductor 94, the viahole conductor 92, the inside wiring 83, the viahole conductor 84, and the outside wiring 82 can be tested. In the state where the wiring 95 is applied with the specified voltage signal by the probe 20, the conductivity of the outside wiring 95, the viahole conductor 96, the inside wiring 91, the viahole conductor 92, the inside wiring 83, the viahole conductor 84, and the outside wiring 82 can be tested.

The present invention is not limited to the foregoing embodiments, but may be carried out in various forms such as described below.

(1) Instead of the amplifier 52 and the inverting amplifier 53, a non-inverting amplifier ad an inverting amplifier each having an amplification factor of 1 may be used. Alternatively, the amplifier 52 and the inverting amplifier 53 may be interchanged by each other.

(2) If $C_2 > C_3$ unlike Equation (6) depending on the setting of the distance d1 between the sensor unit 30 and the circuit board 11, the, amplification factor of the inverting amplifier 53 may be set larger than that of the amplifier 52. For example, if $C_3 \approx C_2/2$, the amplification factor of the inverting amplifier 53 may be set about twice as large as that of the amplifier 52.

Figure 5C:
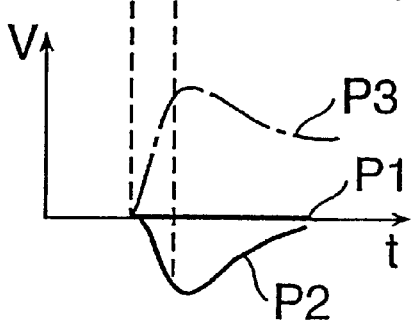
FIG. 5C is a graph showing an output signal of another amplifier of the equivalent circuit shown in FIG. 3.

Specifically, if the level of the voltage signal applied to the wiring 122 via the capacitance $C_3$ is set larger than that of the voltage signal applied to the wiring 122 via the capacitance $C_2$, the output signal of the amplifier 61 in the case of interruption in the wiring 122 becomes zero or negative as shown by bold solid line P1 or thin solid line P2 in FIG. 5C. As a result, whether or not the circuit pathway assembly is satisfactory can be securely judged.

(3) Although the voltage signal whose level changes is outputted from the voltage output means 51 as shown in FIG. 5A in the foregoing embodiments, the voltage signal is not limited thereto. Any electric signal, such as a sinusoidal AC current, rectangular pulse wave signal, or triangular pulse signal, may be applied to the probe so far as its electric parameter changes with time to pass through a capacitive coupling.

In the circuit board testing apparatus, as described above, a first electric signal is applied to a particular portion of a first wiring of a circuit pathway while a second electric signal having a phase reverse to the first electric signal is applied to a second wiring opposite to the first wiring by way of a capacitance. An output electric signal caused on the second wiring by the first and second electric signals is detected to judge whether there is a defect in the circuit pathway. This construction distinguishably differentiates the output of the second wiring in the case of the circuit pathway having no defect from the output of the second wiring in the case of the circuit pathway having a defect. Accordingly, the conductivity of the circuit pathways formed on the circuit board can be checked more accurately.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A testing apparatus for testing conductivity of an electric pathway formed on a substrate, the pathway including a first wiring having an input portion, and a second wiring connected with the first wiring and arranged above the first wiring and at least partially overlapping the first wiring, the testing apparatus comprising:
   a first electric signal applier for applying a first electric signal to the input portion of the first wiring;
   a first electrode facing a first portion of the second wiring with a gap to be capacitively coupled therewith;
   a second electrode facing a second portion of the second wiring with a gap to be capacitively coupled therewith;
   a second electric signal applier for applying a second electric signal to the second electrode, the second electric signal changing its electric parameter in the phase reverse to that of the first electric signal; and a monitor connected to the first electrode for monitoring the signal transmitted to the first electrode through its capacitive coupling.

2. A testing apparatus according to claim 1, further comprising a third electrode facing the second wiring with a gap to be capacitively coupled therewith, the third electrode being interposed between the first and second electrodes and being grounded.

3. A testing apparatus according to claim 1, further comprising:
   a third electrode facing the second wiring with a gap to be capacitively coupled therewith, the third electrode being interposed between the first and second electrode; and
   a third electric signal applier for applying to the third electrode a signal that blocks the influence of the second electric signal to the first electrode.

4. A testing apparatus according to claim 3, further comprising a fourth electrode facing the second wiring with a gap to be capacitively coupled therewith on the opposite side from the second electrode and a fifth electrode facing the second wiring with a gap to be capacitively coupled therewith between the first and fourth electrodes, wherein the fourth electrode is connected with the second electric signal applier and the fifth electrode is connected with the third electric signal applier.

5. A testing apparatus according to claim 3, wherein the third electric signal applier includes a circuit to apply the first electric signal to the third electrode through a non-reverse buffer.

6. A testing apparatus for testing conductivity of a plurality of electric pathways formed on a substrate, each pathway including a first wiring having an input portion, and a second wiring connected with the first wiring and arranged above the first wiring and at least partially overlapping the first wiring, the testing apparatus comprising:
   a first electric signal applier for selectively applying a first electric signal to the input portion of each first wiring;
   a first electrode facing respective first portions of second wirings of pathways with a gap to be capacitively coupled therewith;
   a second electrode facing second portions of second wirings of pathways with a gap to be capacitively coupled therewith;
   a second electric signal applier for applying a second electric signal to the second electrode; and
   a monitor connected to the first electrode for monitoring the signal transmitted to the first electrode through its capacitive coupling.

7. A testing apparatus according to claim 6, further comprising third electrode facing second wirings with a gap to be capacitively coupled therewith, the third electrode being interposed between the first and second electrodes and being grounded.

8. A testing apparatus according to claim 6, further comprising:
   a third electrode facing second wirings with a gap to be capacitively coupled therewith, the third electrode being interposed between the first and second electrodes; and
   a third electric signal applier for applying to the third electrode a signal that blocks the influence of the second electric signal to the first electrode.

9. A testing apparatus according to claim 8, further comprising a fourth electrode facing second wirings with a gap to be capacitively coupled therewith on the opposite side from the second electrode; a fifth electrode facing second wirings with a gap to be capacitively coupled therewith between the first and fourth electrodes, wherein the fourth electrode is connected with the second electric signal applier and the fifth electrode is connected with the third electric signal applier.

10. A testing apparatus according to claim 6, wherein the first electric signal applier includes a signal generator for generating a signal changing its electric parameter with time to pass through a capacitive coupling, a switch assembly for sequentially and selectively connecting the signal generator to one of the first wirings.

11. A testing apparatus according to claim 10, wherein the first electric signal applier further includes a plurality of probes to be in contact with the first wirings, and the switch assembly is connected with the probes.

12. A testing apparatus according to claim 6, wherein the apparatus is adapted to test pathways of which first wirings are formed on one side of the substrate and second wirings are formed on the other side of the substrate.

13. A testing apparatus according to claim 12, wherein the first signal applier includes probes to be electrically connected with the input portions of first wirings on one side of the substrate, and the first and second electrodes are to face second wirings on the other side of the substrate.

14. A testing apparatus according to claim 6, wherein the apparatus is adapted to test pathways of which first and second wirings are formed on the one side of the substrate.

15. A testing apparatus according to claim 14, wherein the input portions of first wirings and second wirings are exposed to atmosphere, and the first signal applier includes probes to be electrically connected with the input portions of first wirings, and the first and second electrodes are to face second wirings.

16. A method for testing conductivity of at least one electric pathway formed on a substrate, the electric pathway including a first wiring having an input portion, and a second wiring connected with the first wiring and arranged above the first wiring and at least partially overlapping the first wiring, the method comprising steps of:
   generating a first electric signal of which electric parameter changes with time to be transmitted through a capacitive coupling;
   applying the first electric signal to the input portion of first wiring;
   rendering a first electrode facing a first portion of the second wiring with a gap to be capacitively coupled therewith;
   rendering a second electrode facing a second portion of the second wiring with a gap to be capacitively coupled therewith;
   generating a second electric signal having a phase reverse to that of the first electric signal;
   applying the second electric signal to the second electrode while the first signal is being applied; and
   monitoring the signal transmitted to the first electrode through its capacitive coupling.

17. A method according to claim 16, further comprising a step of interposing a third electrode between the first and second electrodes to face the second wiring with a gap to be capacitively coupled therewith, the third electrode being grounded.

18. A method according to claim 16, further comprising steps of:
   interposing a third electrode between the first and second electrodes to facing the second wiring with a gap to be capacitively coupled therewith;

generating a blocking signal of blocking the influence of the second electric signal to the first electrode; and applying to the third electrode the first electric signal through a non-reverse buffer while the first signal is being applied.

19. A method according to claim 16, further comprising steps of:

interposing a third electrode between the first and second electrodes to face the second wiring with a gap to be capacitively coupled therewith;

generating a blocking signal for blocking the influence of the second electric signal to the first electrode; and applying the blocking signal to the third electrode while the first signal is being applied.

20. A method according to claim 19, further comprising steps of:

rendering a fourth electrode facing the second wiring with a gap to be capacitively coupled therewith on the opposite side from the second electrode;

rendering a fifth electrode facing the second wiring with a gap to be capacitively coupled therewith between the first and fourth electrodes;

applying the second electric signal to the fourth electrode while the first signal is being applied; and applying the blocking signal to the fifth electrode while the first signal is being applied.

21. A method according to claim 16, wherein the method is adapted to test conductivity of a plurality of electric pathways formed on a substrate, each pathway including a first wiring having an input portion, and a second wiring connected with the first wiring and arranged above the first wiring and at least partially overlapping the first wiring.

22. A method according to claim 21, wherein the first electric signal application step includes a step of sequentially and selectively applying the first signal to one of the first wirings.

23. A method according to claim 21, wherein the method is adapted to test pathways of which first wirings are formed on one side of the substrate and second wirings are formed on the other side of the substrate.

24. A method according to claim 21, wherein the method is adapted to test pathways of which first and second wirings are formed on the one side of the substrate.

* * * * *